(12) United States Patent
Kim et al.

(10) Patent No.: US 7,371,621 B2
(45) Date of Patent: May 13, 2008

(54) THIN FILM TRANSISTOR ARRAY PANEL AND FABRICATION

(75) Inventors: Sang-Gab Kim, Seoul (KR);
Woo-Geun Lee, Yongin-si (KR);
Shi-Yul Kim, Yongin-si (KR); Jin-Ho Ju, Seoul (KR); Jang-Soo Kim, Suwon-si (KR); Sang-Woo Whangbo, Seoul (KR); Min-Seok Oh, Yongin-si (KR); Hye-Young Ryu, Seoul (KR); Hong-Kee Chin, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 63 days.

(21) Appl. No.: 11/486,330

(22) Filed: Jul. 12, 2006

(65) Prior Publication Data
US 2007/0012967 A1    Jan. 18, 2007

(30) Foreign Application Priority Data
Jul. 12, 2005   (KR)   ...................... 10-2005-0062730

(51) Int. Cl.
*H01L 21/00*   (2006.01)
(52) U.S. Cl. ................ 438/149; 438/151; 257/E21.414
(58) Field of Classification Search ................ 438/149, 438/151; 257/E21.414
See application file for complete search history.

(56) References Cited

U.S. PATENT DOCUMENTS 7,253,035 B2 *   8/2007   Kwak .......................... 438/149
2002/0117691 A1 *   8/2002   Choi et al. ................... 257/225

FOREIGN PATENT DOCUMENTS

JP            6-69236            3/1994

(Continued)

OTHER PUBLICATIONS

Patent Abstracts of Japan, Publication No. 06-069236, Mar. 11, 1994, 1 page.

(Continued)

*Primary Examiner*—Andy Huynh
(74) *Attorney, Agent, or Firm*—MacPherson Kwok Chen & Heid LLP; Mark Pellegrini

(57) ABSTRACT

The present invention provides a manufacturing method of a thin film transistor array panel, which includes forming a gate line on a substrate; forming a gate insulating layer, a semiconductor layer, and an ohmic contact on the gate line; forming a first conducting film including Mo, a second conducting film including Al, and a third conducting film including Mo on the ohmic contact; forming a first photoresist pattern on the third conducting film; etching the first, second, and third conducting films, the ohmic contact, and the semiconductor layer using the first photoresist pattern as a mask; removing the first photoresist pattern by a predetermined thickness to form a second photoresist pattern; etching the first, second, and third conducting films using the second photoresist pattern as a mask to expose a portion of the ohmic contact; and etching the exposed ohmic contact using a Cl-containing gas and a F-containing gas.

9 Claims, 17 Drawing Sheets

FOREIGN PATENT DOCUMENTS

| | | |
|---|---|---|
| JP | 6-267983 | 9/1994 |
| JP | 2000-56284 | 2/2000 |
| JP | 2004-119923 | 4/2004 |
| KR | 1999-0066167 | 8/1999 |
| KR | 2001-0091799 | 10/2001 |

OTHER PUBLICATIONS

Patent Abstracts of Japan, Publication No. 2004-119923, Apr. 15, 2004, 1 page.

Patent Abstracts of Japan, Publication No. 06-267983, Sep. 22, 1994, 1 page.

Patent Abstracts of Japan, Publication No. 2000-056284, Feb. 25, 2000, 1 page.

Korean Patent Abstract of Publication No. 1999-0066167, Aug. 16, 1998, 1 page.

Korean Patent Abstract, Publication No. 1020010091799 A, Oct. 23, 2001, 1 page.

* cited by examiner

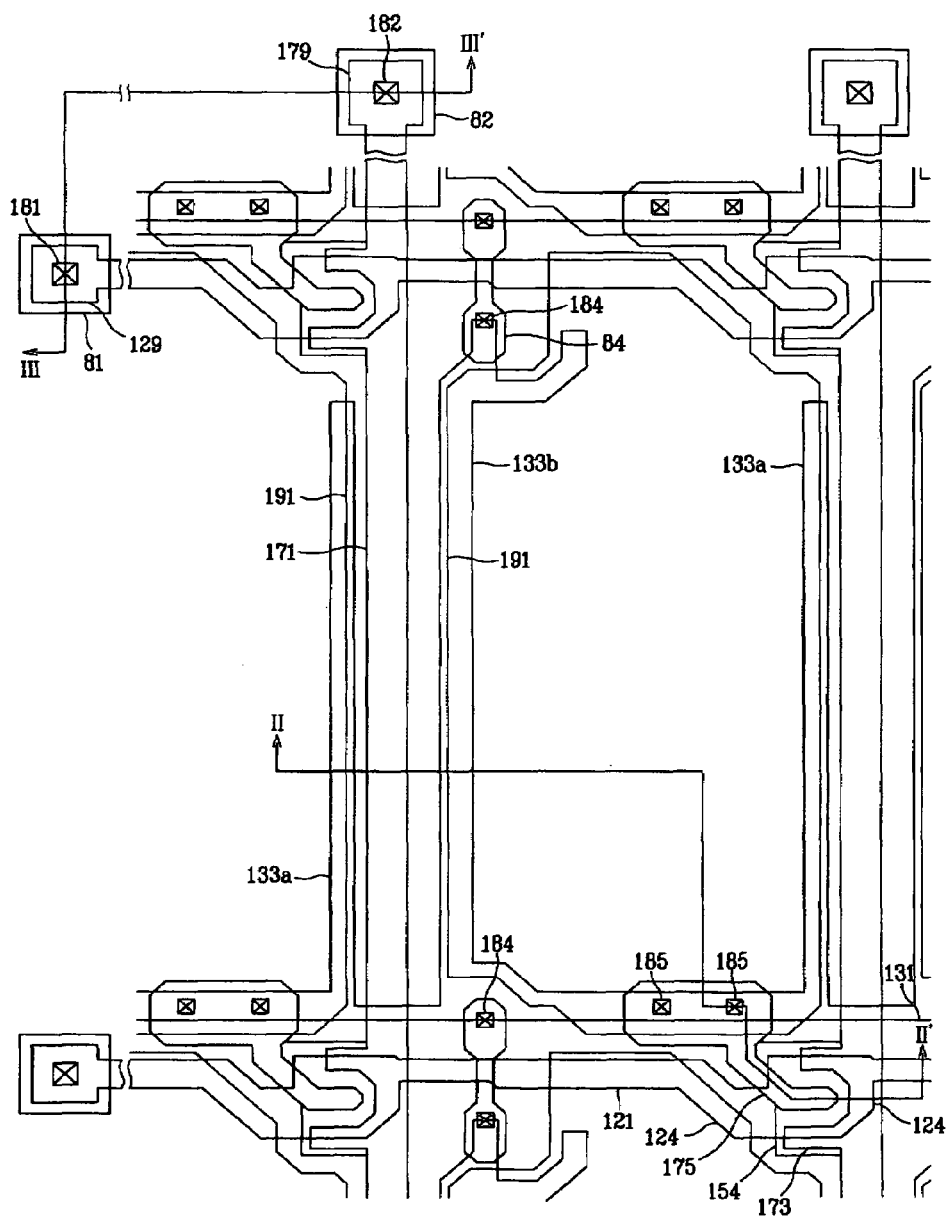
[FIG. 1]

[FIG. 2]
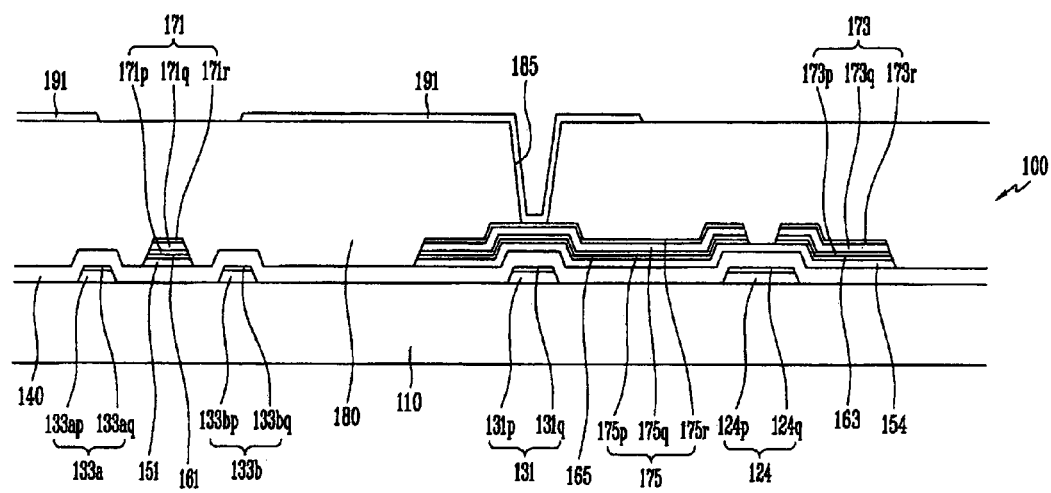

[FIG. 3]
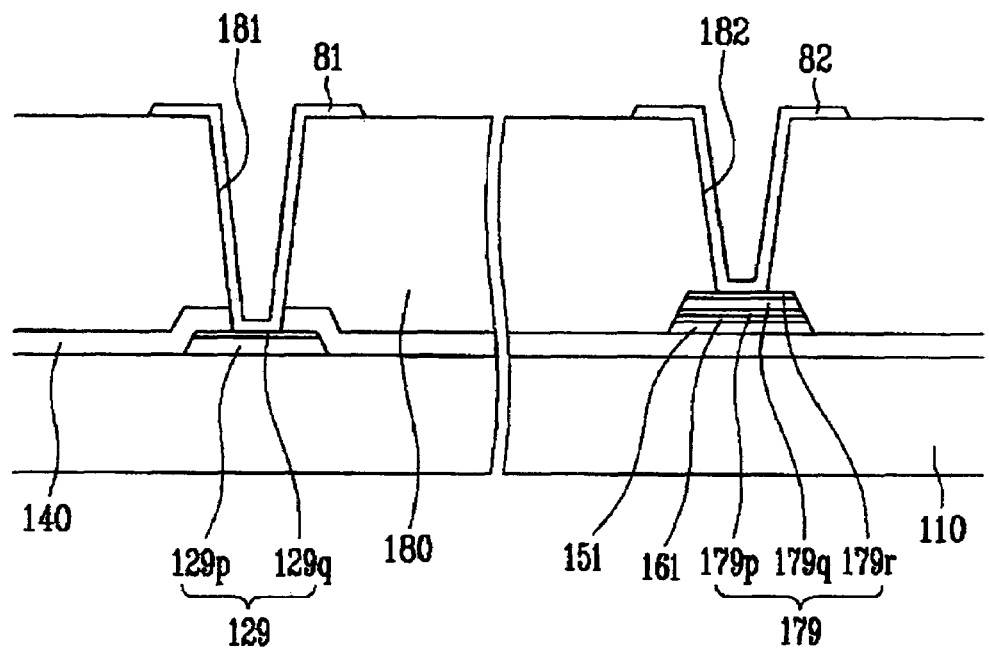

[FIG. 4]
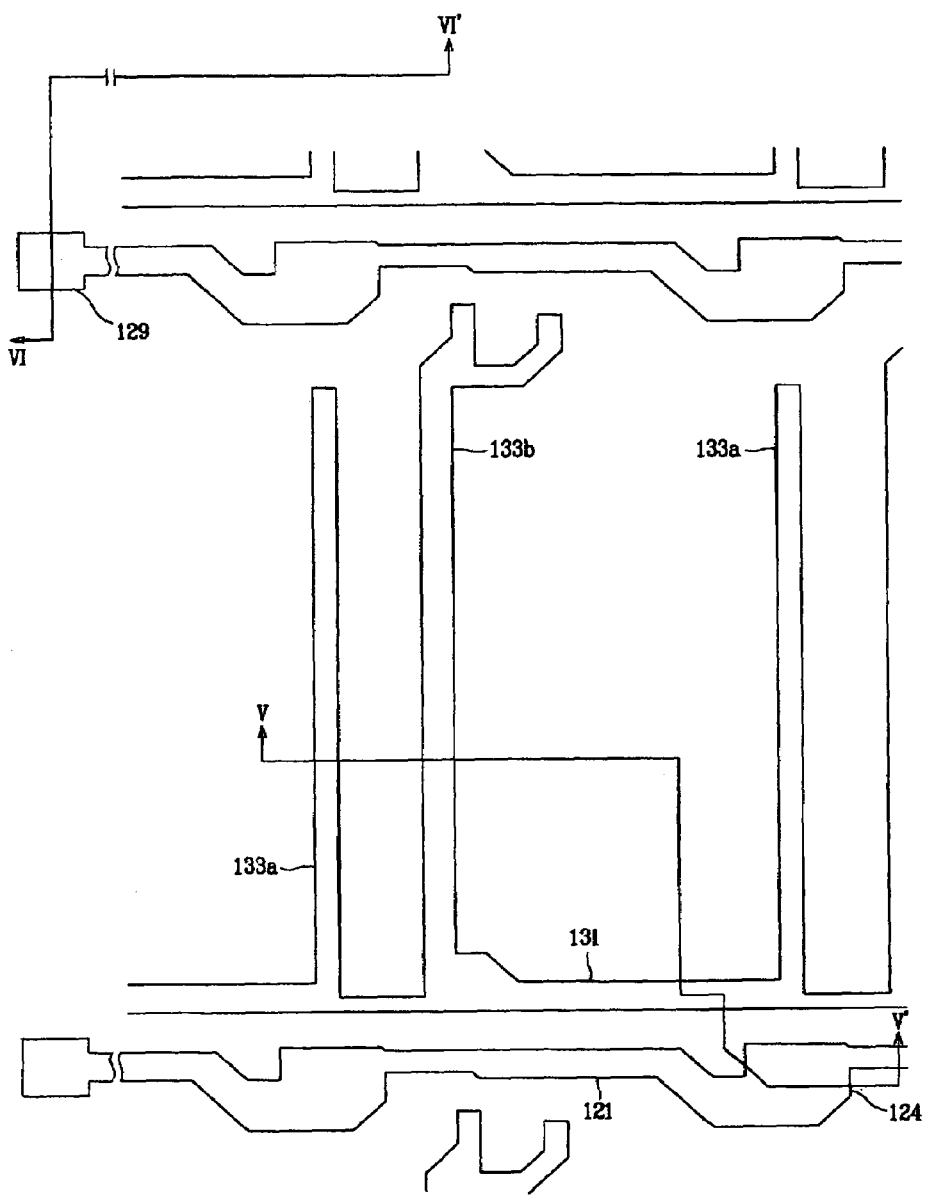

[FIG. 5]
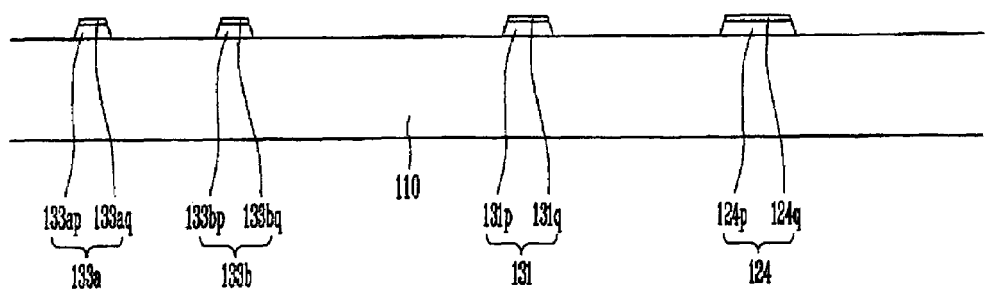
[FIG. 6]
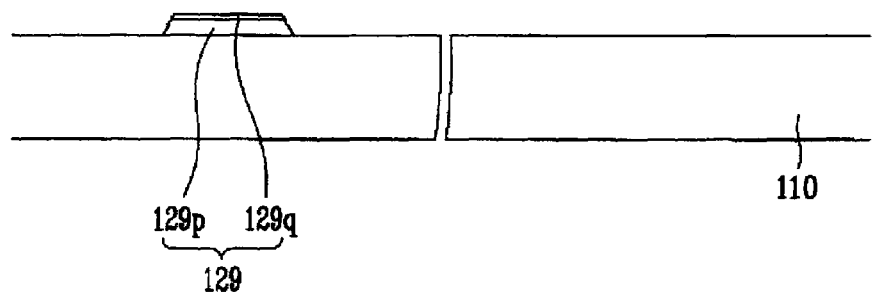

[FIG. 7]
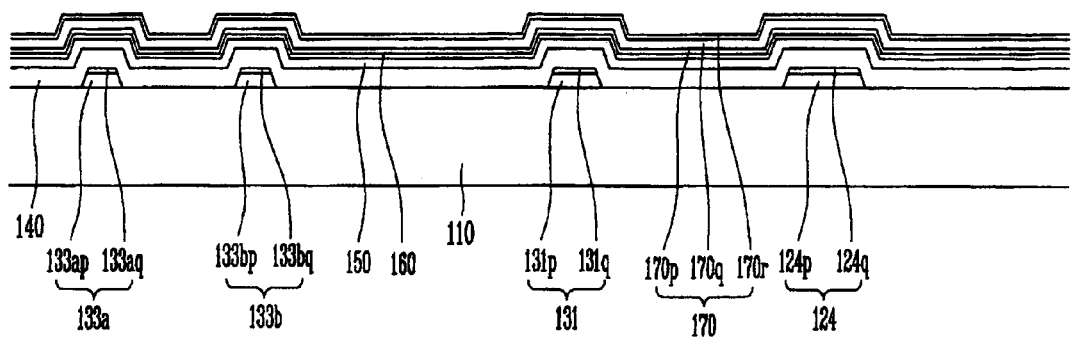
[FIG. 8]
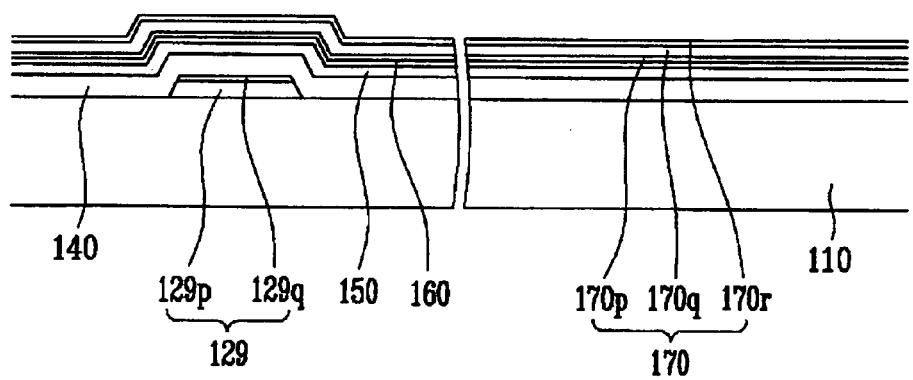

[FIG. 9]
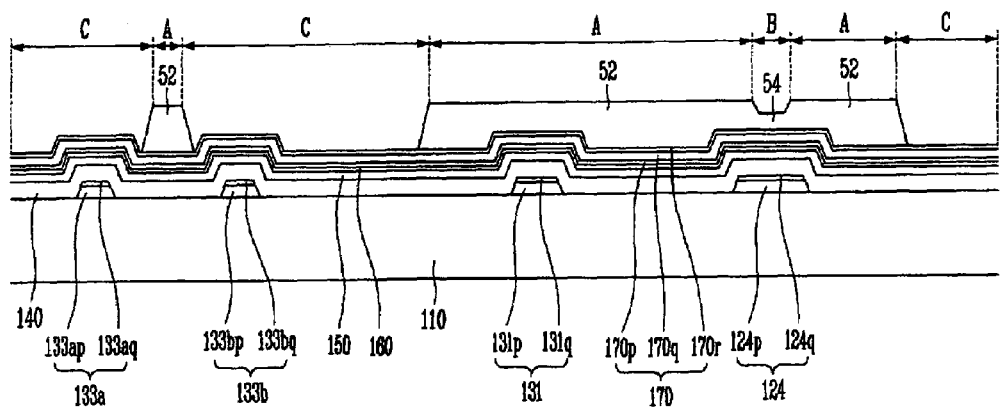
[FIG. 10]
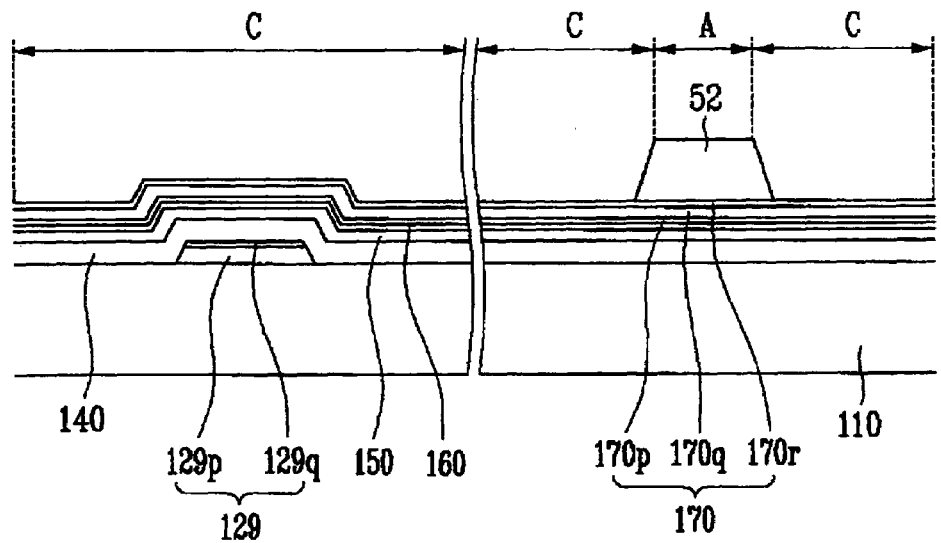

[FIG. 11]
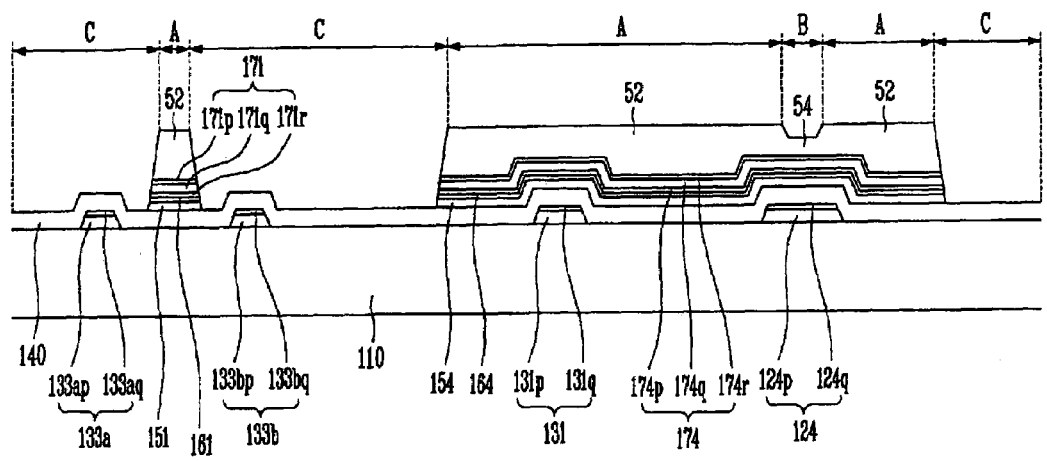
[FIG. 12]
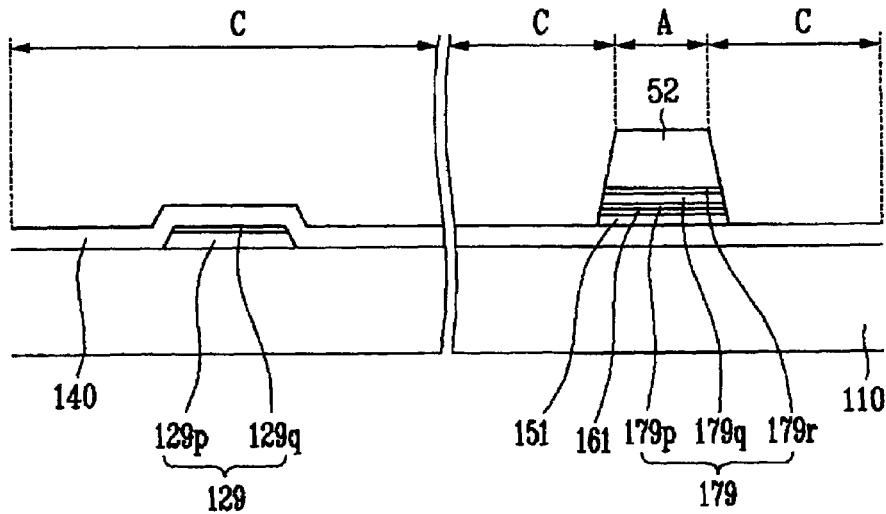

[FIG. 13]
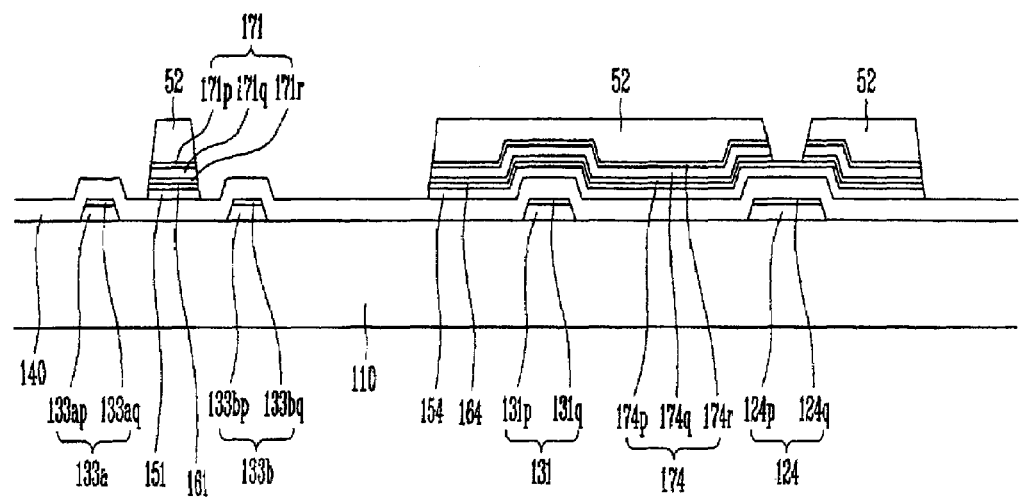

[FIG. 14]
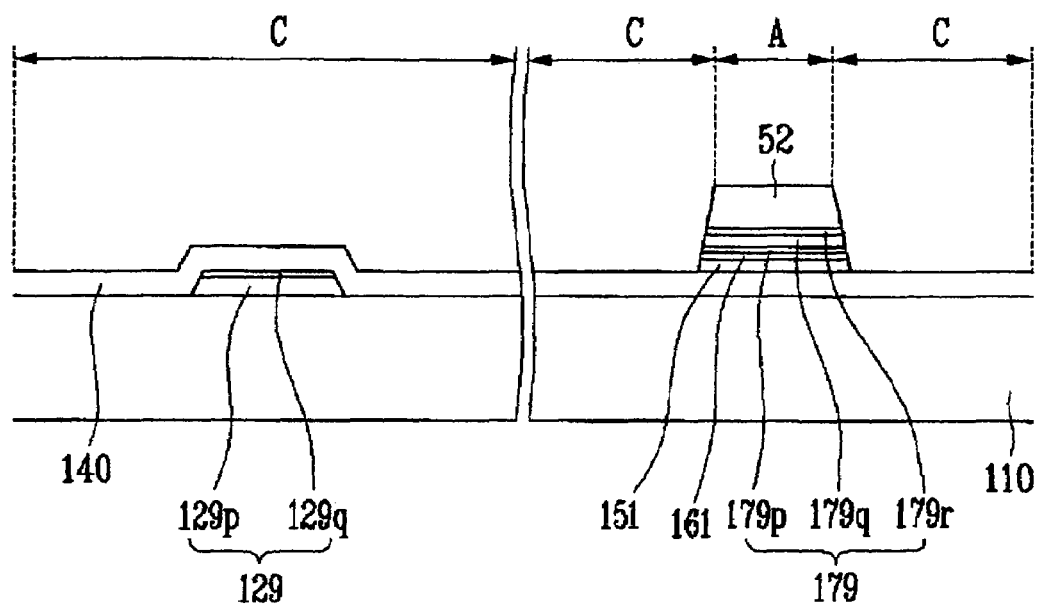

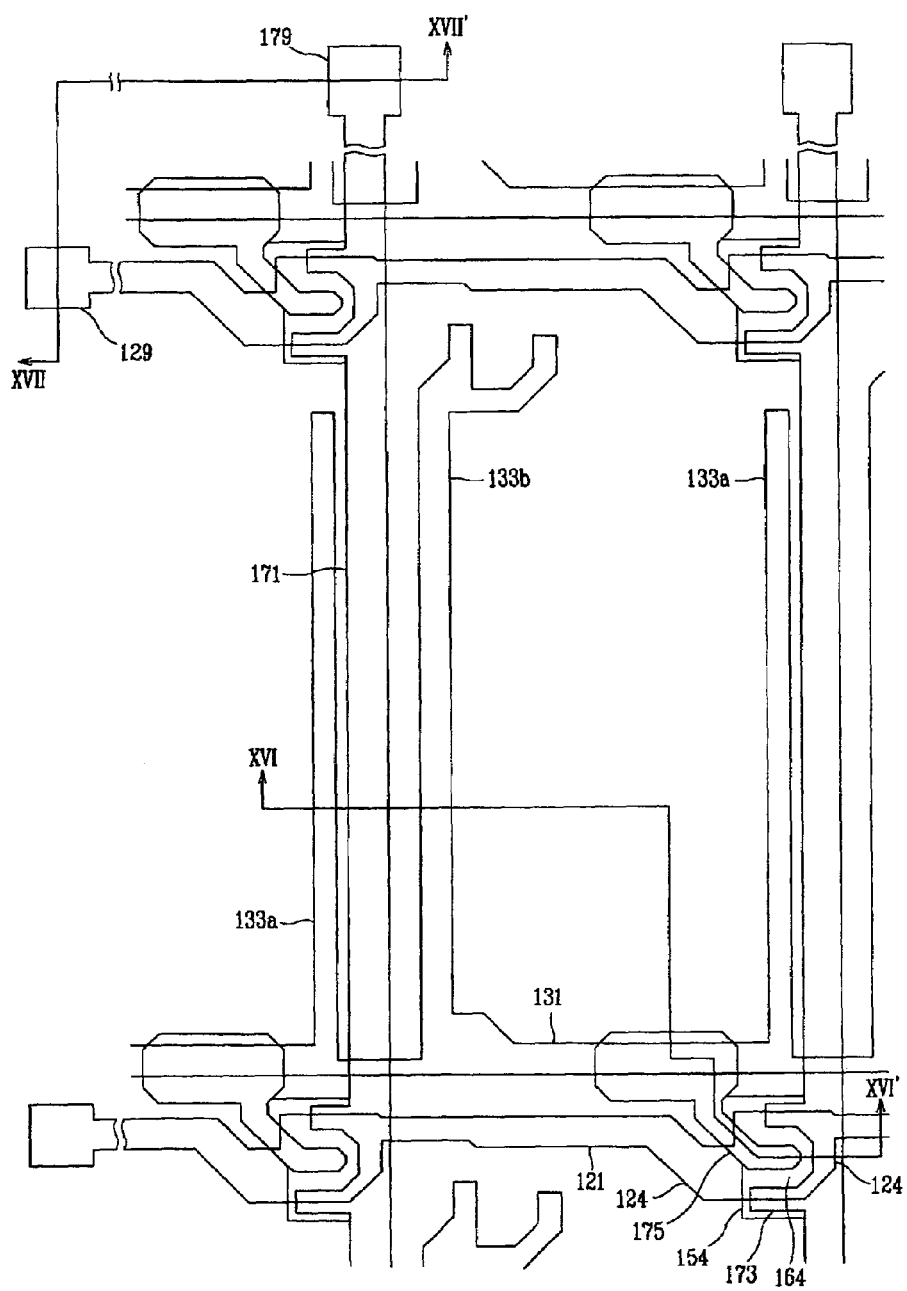
[FIG. 15]

[FIG. 16]
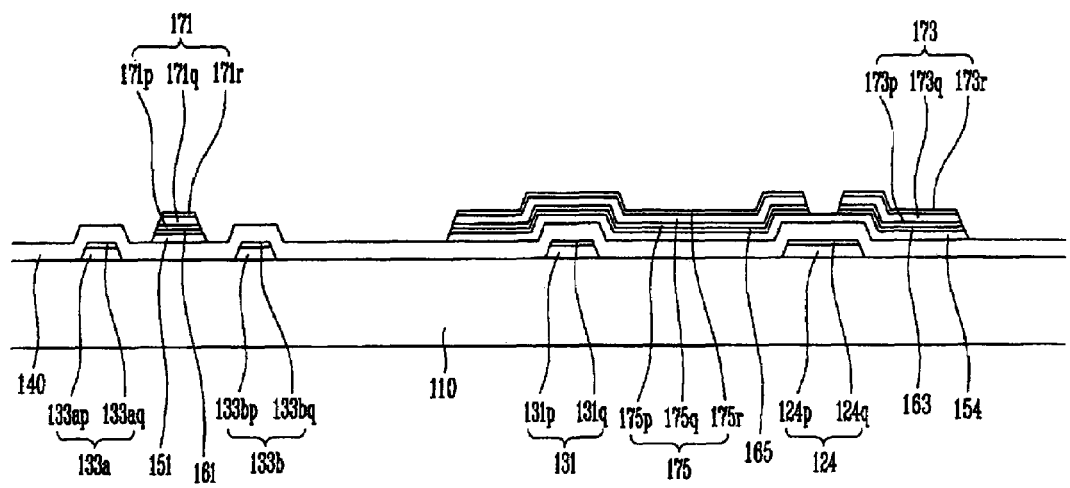
[FIG. 17]
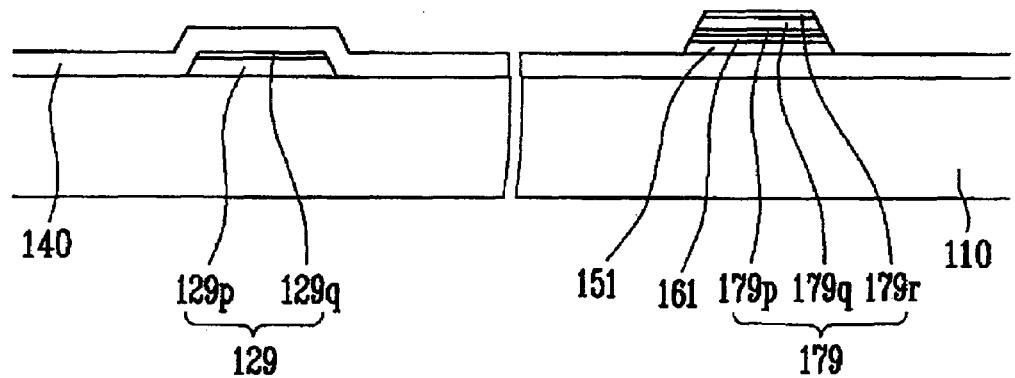

[FIG. 18]
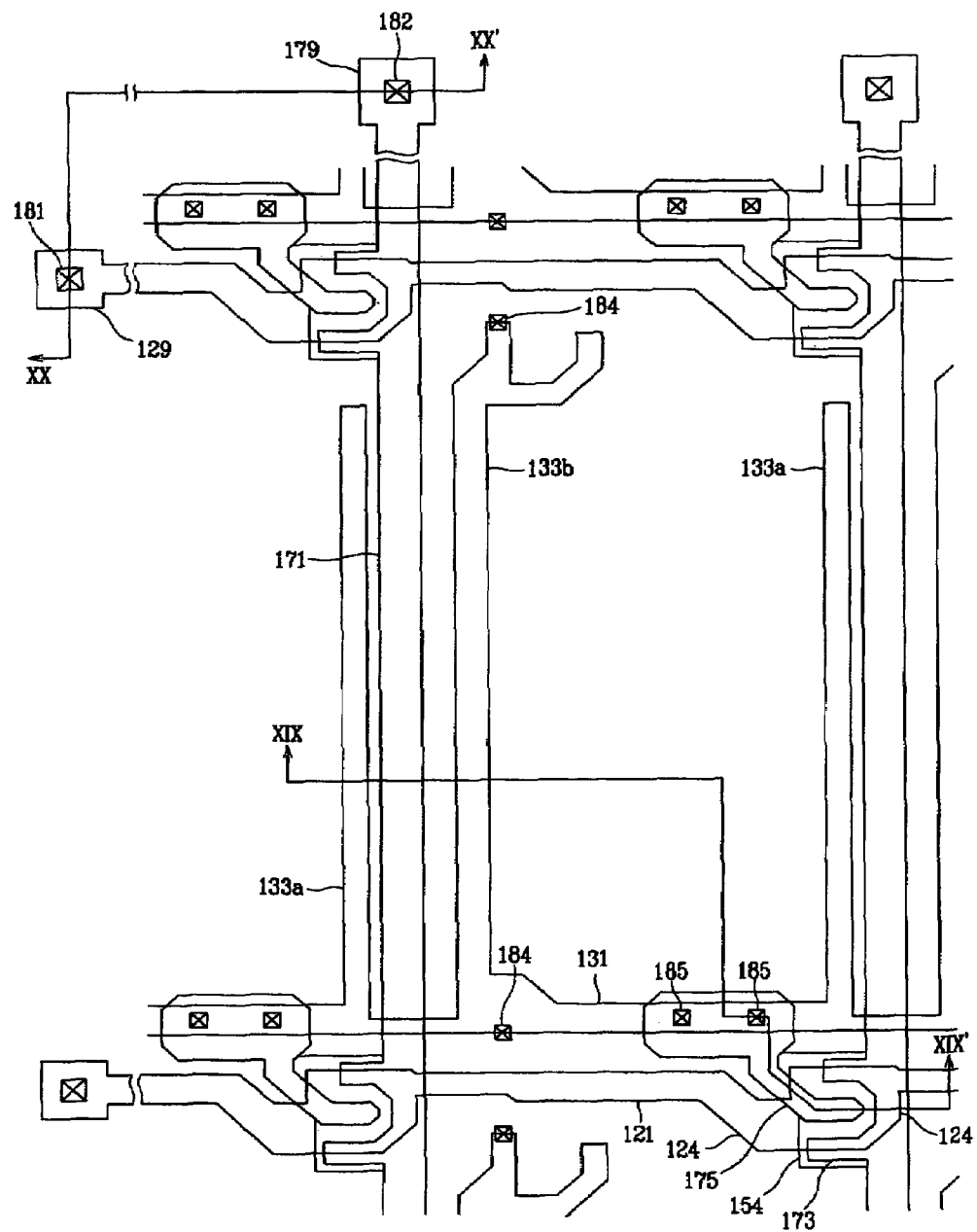

[FIG. 19]
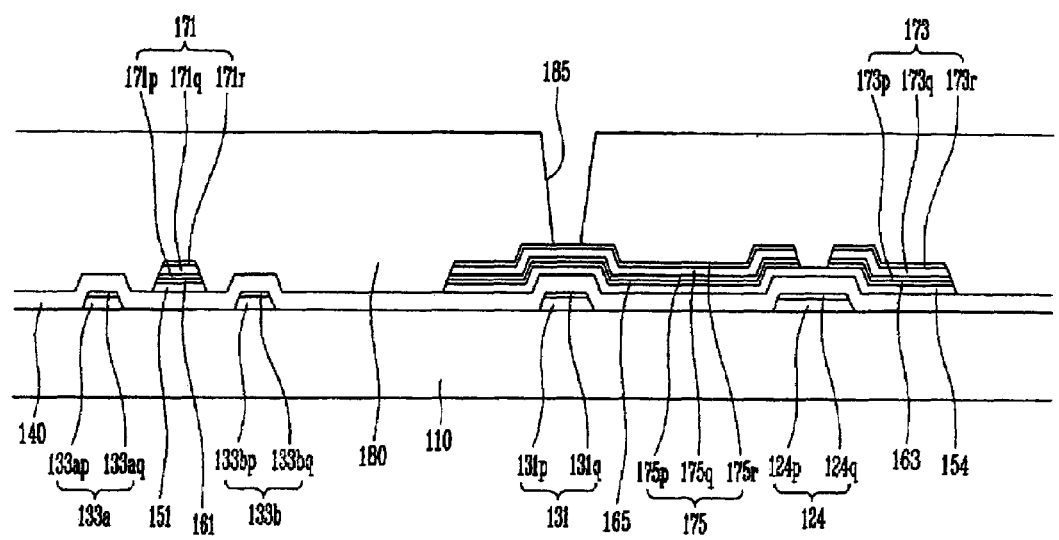

[FIG. 20]
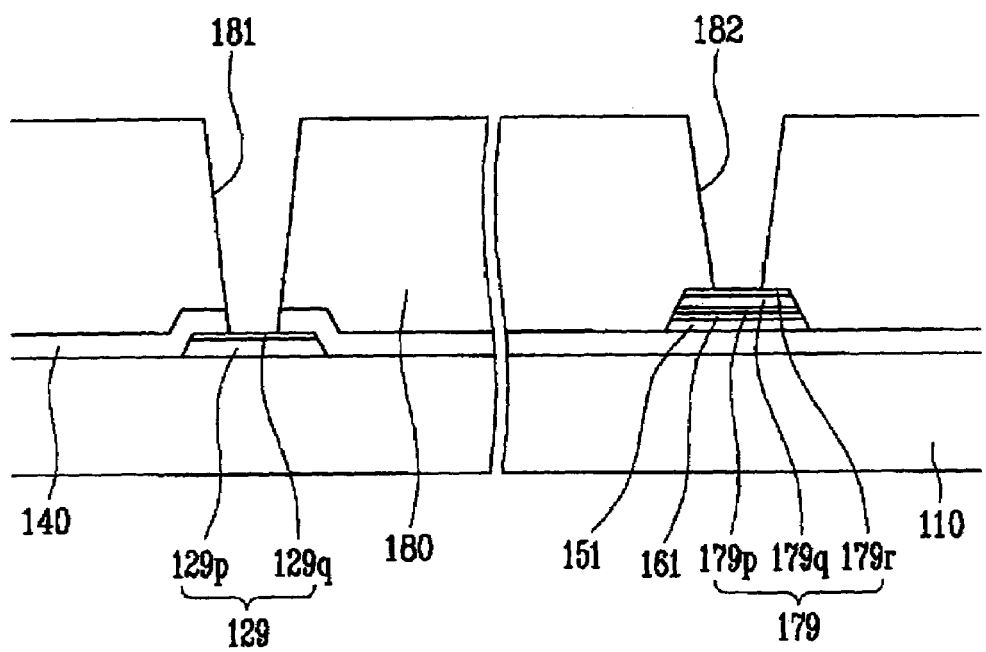

[FIG. 21A]
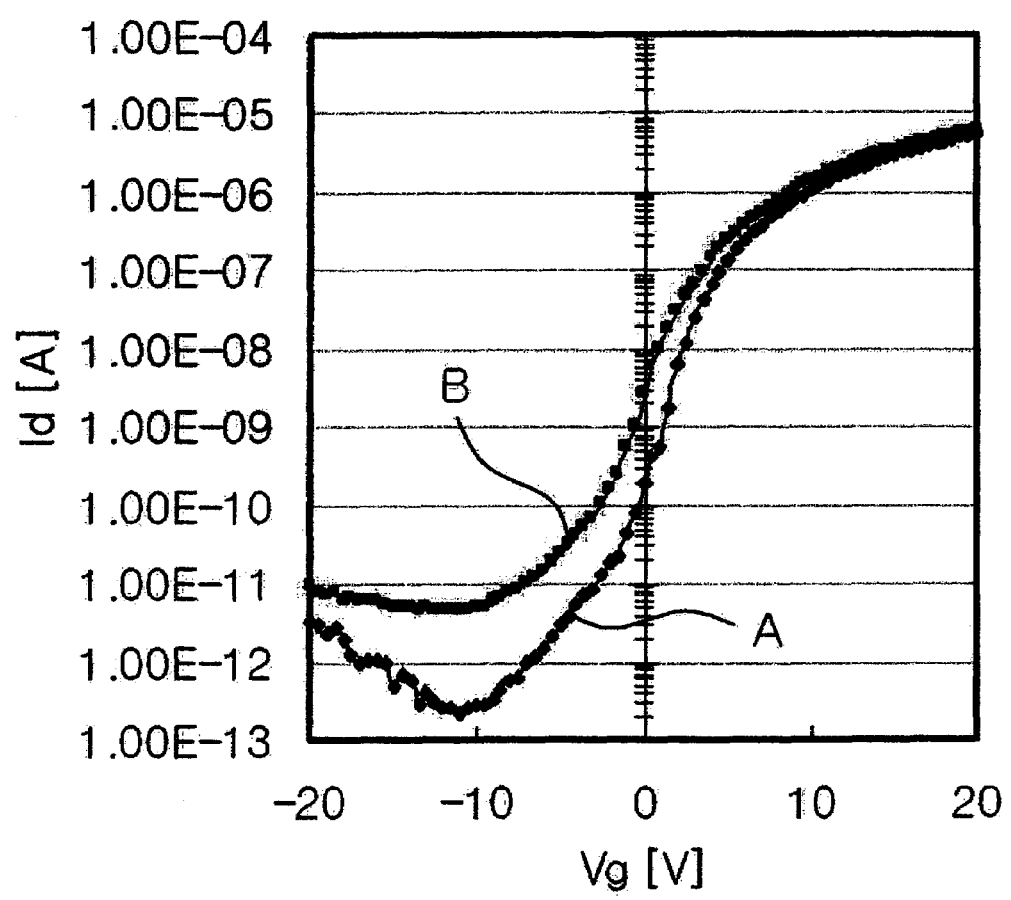

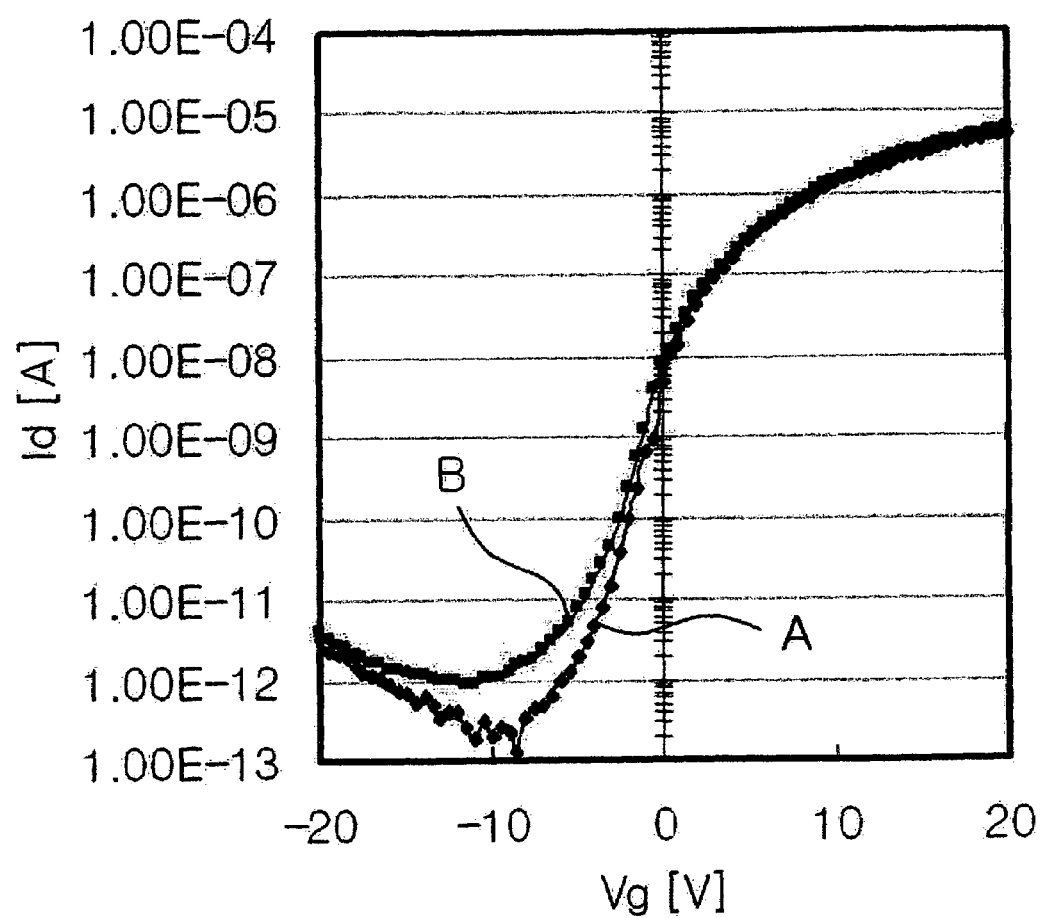
[FIG. 21B]

THIN FILM TRANSISTOR ARRAY PANEL AND FABRICATION

CROSS-REFERENCE TO RELATED APPLICATION

This application claims priority to and the benefit of Korean Patent Application No. 10-2005-0062730 filed in the Korean Intellectual Property Office on Jul. 12, 2005, the contents of which is hereby incorporated by reference.

FIELD OF THE INVENTION

The present invention relates to a thin film transistor array panel and a manufacturing method thereof.

DESCRIPTION OF THE RELATED ART

Liquid crystal displays (LCDs) are one of the most widely used flat panel displays. An LCD includes a liquid crystal (LC) layer interposed between two panels wherein one panel (referred to as "a thin film transistor array panel") has a plurality of pixel electrodes in a matrix and the other (referred to as "a common electrode panel"), has a common electrode covering the entire surface of the panel. The LCD displays images by applying voltages to the field-generating electrodes to generate an electric field in the LC layer that determines the orientation of the LC molecules in the LC layer to adjust the polarization of incident light. Thin film transistors (TFTs) having three terminals are connected to the pixel electrodes. Gate lines transmit signals for controlling the thin film transistors and the data lines transmit voltages applied to the pixel electrodes are formed on a thin film transistor array panel. The thin film transistor array panel includes a plurality of thin films having conducting films such as the gate lines and the data lines, a semiconductor layer, and an insulating layer. The respective thin films are patterned using separate masks.

The various patterning steps such as applying the photolithographic mask, exposing to light, developing, and cleansing are repeated for each separate mask thereby making the manufacturing process costly and time consuming. Therefore, it is preferable to decrease the number of required masks. However, when the metal layer for the data lines and the semiconductor are etched using the same mask, some of the semiconductor layer is left on the entire surface under the etched metal layer causing afterimages because of light leakage from the semiconductor area.

SUMMARY OF THE INVENTION

In accordance with the invention, the after image problem is eliminated even though the metal patterns for the multi-layered data lines structured of an Al film and an underlying Mo film and the intrinsic semiconductor are etched using the same photoresist pattern. The diffusion of Mo into the semiconductors and the splitting of impurities from the lower Al film are prevented from polluting the semiconductor channel during wet etching. In forming the channel areas, the flow ratio of the chlorine-containing gas and the fluorine-containing gas is controlled within a predetermined ratio.

BRIEF DESCRIPTION OF THE DRAWING

The foregoing objects and features of the present invention may become more apparent from a reading of the ensuing description together with the drawing, in which:

FIG. 1 is layout view of a TFT array panel according to an embodiment of the present invention;

FIGS. 2 and 3 are sectional views of the TFT array panel shown in FIG. 1 taken along the lines II-II' and III-III';

FIGS. 4, 15, and 18 are layout views of the TFT array panel in intermediate steps of a manufacturing method thereof according to an embodiment of the present invention;

FIGS. 5 and 6 are sectional views of the TFT array panel shown in FIG. 4 taken along the lines V-V' and VI-VI';

FIGS. 7 to 14 are sectional views sequentially showing a manufacturing method of a TFT array panel according to an embodiment of the present invention;

FIGS. 16 and 17 are sectional views of the TFT array panel shown in FIG. 15 taken along the lines XVI-XVI' and XVII-XVII';

FIGS. 19 and 20 are sectional views of the TFT array panel shown in FIG. 18 taken along the lines XIX-XIX' and XX-XX'; and FIGS. 21A and 21B are graphs indicating characteristics of a TFT in accordance with a supplied amount of Cl.

DETAILED DESCRIPTION

An exemplary embodiment of the present invention will hereinafter be described in detail with reference to the accompanying drawings. As those skilled in the art would realize, the described embodiments may be modified in various different ways, all without departing from the spirit or scope of the present invention. In the drawings, the thickness of layers, films, panels, regions, etc., are exaggerated for clarity. Like reference numerals designate like elements throughout the specification. It will be understood that when an element such as a layer, region, or substrate is referred to as being "on" another element, it can be directly on the other element or intervening elements may also be present. In contrast, when an element is referred to as being "directly on" another element, there are no intervening elements present.

A TFT array panel according to an embodiment of the present invention will be described in detail with reference to FIGS. 1 to 3. FIG. 1 is layout view of a TFT array panel according to an embodiment of the present invention, and FIGS. 2 and 3 are sectional views of the TFT array panel shown in FIG. 1 taken along the lines II-II' and III-III'.

A plurality of gate lines 121 and a plurality of storage electrode lines 131 are formed on an insulating substrate 110 made of a material such as transparent glass or plastic. Gate lines 121 transmit gate signals and extend substantially in a transverse direction. Each of gate lines 121 includes a plurality of gate electrodes 124 projecting downward, and an end portion 129 having a large area for contact with another layer or an external driving circuit. A gate driving circuit (not shown) generates the gate signals and may be mounted on a flexible printed circuit (FPC) film (not shown), which may be attached to the substrate 110, directly mounted on the substrate 110, or integrated into the substrate 110. Gate lines 121 may be connected to a driving circuit that may be integrated into the substrate 110.

Storage electrodes 131 are supplied with a predetermined voltage, and each of storage electrode lines 131 includes a stem extending substantially parallel to gate lines 121 and a plurality of pairs of storage electrodes 133a and 133b branched from the stem. Each of storage electrode lines 131 is disposed between two adjacent gate lines 121, and the stem is close to a lower one of the two adjacent gate lines 121. Each of storage electrodes 133a and 133b has a fixed end portion connected to the stem and a free end portion disposed opposite thereto. The fixed end portion of storage electrode 133b has a large area, and the free end portion thereof is bifurcated into a linear branch and a curved branch. However, storage electrode lines 131 may have various shapes and arrangements.

Gate lines 121 and storage electrode lines 131 include lower films 124p, 131p, 133ap, and 133bp including an Al-containing metal such as Al or a Al alloy, and upper films 124q, 131q, 133aq, and 133bq including an Mo-containing metal such as Mo or a Mo alloy. Al—Nd, which Nd is added to Al in a predetermined amount may be used as the Al-containing metal. The thickness of the lower films 124p, 131p, 133ap, and 133bp may be about 100 Å to 5000 Å, and the thickness of the upper films 124q, 131q, 133aq, and 133bq may be about 50 Å to 2000 Å.

In FIGS. 2 and 3, for gate electrodes 124 and storage electrode lines 131, the lower and upper films thereof are denoted by the additional characters p and q, respectively. The lateral sides of gate lines 121 and storage electrode lines 131 are inclined relative to a surface of the substrate 110, and the inclination angles thereof range about 30-80 degrees. A gate insulating layer 140, preferably made of silicon nitride (SiNx) or silicon oxide (SiOx), is formed on gate lines 121 and storage electrode lines 131. A plurality of semiconductor stripes 151 preferably made of hydrogenated amorphous silicon (abbreviated to "a-Si") or polysilicon are formed on gate insulating layer 140. Each of the semiconductor stripes 151 extends substantially in the longitudinal direction and includes a plurality of projections 154 branched out toward gate electrodes 124. The semiconductor stripes 151 become wide near gate lines 121 and storage electrode lines 131 such that the semiconductor stripes 151 cover large areas of gate lines 121 and storage electrode lines 131.

A plurality of ohmic contact stripes and islands 161 and 165 are formed on the semiconductor stripes 151. The ohmic contact stripes and islands 161 and 165 are preferably made of n+ hydrogenated a-Si heavily doped with an n-type impurity such as phosphorous P, or they may be made of silicide. Each ohmic contact stripe 161 includes a plurality of projections 163, and the projections 163 and the ohmic contact islands 165 are located in pairs on the projections 154 of the semiconductor stripes 151. The lateral sides of the semiconductor stripes 151 and the ohmic contacts 161 and 165 are inclined relative to the surface of the substrate 110, and the inclination angles thereof are preferably in a range of about 30-80 degrees.

A plurality of data lines 171 and a plurality of drain electrodes 175 are formed on the ohmic contacts 161 and 165 and gate insulating layer 140. Data lines 171 transmit data signals and extend substantially in the longitudinal direction to intersect gate lines 121. Each data line 171 also intersects storage electrode lines 131 and runs between adjacent pairs of storage electrodes 133a and 133b. Each data line 171 includes a plurality of source electrodes 173 projecting toward gate electrodes 124 and an end portion 179 having a large area for contact with another layer or an external driving circuit. A data driving circuit (not shown) for generating data signals may be mounted on an FPC film (not shown), which may be attached to the substrate 110, directly mounted on the substrate 110, or integrated into the substrate 110. Data lines 171 may extend to be connected to a driving circuit that may be integrated into the substrate 110.

Drain electrodes 175 are separated from data lines 171 and are disposed opposite source electrodes 173 with respect to gate electrodes 124. Each of drain electrodes 175 includes a wide end portion and a narrow end portion. The wide end overlaps storage electrode line 131 and the narrow end is partly enclosed by source electrode 173.

Gate electrode 124, source electrode 173, and drain electrode 175 along with projection 154 of semiconductor stripe 151 form a TFT having a channel in projection 154 between source electrode 173 and drain electrode 175.

Data lines 171 and drain electrodes 175 have a triple-layered structure including a lower film 171p and 175p, an intermediate film 171q and 175q, and an upper film 171r and 175r. The lower film 171p and 175p is preferably made of Mo or a Mo-containing metal of a Mo alloy such as MoN, MoNb, MoV, MoTi, and MoW, the intermediate film 171q and 175q is preferably made of a low resistivity metal of Al or an Al-containing metal such as AlNd, and the upper film 171r and 175r is made of Mo or a Mo-containing metal of a Mo alloy such as MoN, MoNb, MoV, MoTi, and MoW having a good contact characteristic with ITO or IZO.

In FIGS. 2 and 3, the lower, intermediate, and upper films of source electrodes 173 and of end portions 179, are denoted by additional characters p, q, and r, respectively. Data lines 171 and drain electrodes 175 have edge profiles inclined at an angle of about 30-80 degrees.

Ohmic contacts 161 and 165 are interposed only between the underlying semiconductor stripes 151 and the overlying conductors 171 and 175 to reduce contact resistance therebetween.

Semiconductor stripes 151 have almost the same planar shapes as data lines 171 and drain electrodes 175 as well as the underlying ohmic contacts 161 and 165, except for the projections 154 on which TFTs are formed. That is, the semiconductor stripes 151 are formed under data lines 171 and drain electrodes 175 and the underlying ohmic contacts 161, 163, and 165, and include some exposed portions that are not covered with data lines 171 and drain electrodes 175, such as the portions located between the source electrodes 173 and drain electrodes 175.

A passivation layer 180 is formed on data lines 171, drain electrodes 175, and the exposed portions of the semiconductor stripes 151. Passivation layer 180 may be made of inorganic insulators such as silicon nitride and silicon oxide, an organic insulator, or a low dielectric insulator, and it may have a flat top surface. The organic insulator and the low dielectric insulator may have a dielectric constant of less than about 4.0. Examples of the low dielectric insulator include a-Si:C:O and a-Si:O:F formed by plasma enhanced chemical vapor deposition (PECVD). The organic insulator may exhibit photosensitivity. Passivation layer 180 may include a lower film of an inorganic insulator and an upper film of an organic insulator, such that it takes on the excellent insulating characteristics of the organic insulator while preventing the exposed portions of the semiconductor stripes 151 from being damaged by the organic insulator.

Passivation layer 180 has a plurality of contact holes 182 and 185 exposing the end portions 179 of data lines 171 and drain electrodes 175, respectively. Passivation layer 180 and gate insulating layer 140 have a plurality of contact holes 181 exposing the end portions 129 of gate lines 121 and a plurality of contact holes 184 exposing portions near the fixed end portions of storage electrode 133a and 133b or portions of the free end portions of storage electrode lines 131.

A plurality of pixel electrodes 191, a plurality of overpasses 83, and a plurality of contact assistants 81 and 82 are formed on the passivation layer 180. They are preferably made of a transparent conductor such as ITO or IZO or a reflective conductor such as Ag, Al, or alloys thereof. Pixel electrodes 191 are physically and electrically connected to drain electrodes 175 through the contact holes 185 such that pixel electrodes 191 receive data voltages from drain electrodes 175. Pixel electrodes 191 supplied with data voltages generate electric fields in cooperation with a common electrode (not shown) of an opposing display panel (not shown) supplied with a common voltage, This voltage determines the orientation of the liquid crystal molecules (not shown) of the liquid crystal layer (not shown) disposed between the two electrodes. A pixel electrode 191 and the common electrode form a capacitor referred to as the "liquid crystal capacitor" which stores applied voltages after the TFT is turned off.

Pixel electrode 191 overlaps storage electrode line 131 including storage electrodes 133a and 133b. Pixel electrode 191, drain electrode 175 connected thereto, and storage electrode line 131 form an additional capacitor referred to as a "storage capacitor," which enhances the charge storing capacity of the liquid crystal capacitor.

Contact assistants 81 and 82 are connected to end portions 129 of gate lines 121 and end portions 179 of data lines 171 through contact holes 181 and 182, respectively. Contact assistants 81 and 82 protect end portions 129 and 179 and enhance the adhesion between the end portions and external devices.

Overpasses 84 cross over gate lines 121 and are connected to the exposed portions of storage electrode lines 131 and the exposed end portions of the free end portions of storage electrodes 133b through a pair of contact holes 184, respectively, which are disposed opposite each other with respect to gate lines 121. Storage electrode lines 131 including storage electrodes 133a and 133b along with the overpasses 84 can be used for repairing defects in gate lines 121, data lines 171, or the TFTs.

The method of manufacturing the TFT array panel shown in FIGS. 1 to 3 according to an embodiment of the present invention will be described in detail with reference to FIGS. 4 to 20 as well as FIGS. 1 to 3. As shown in FIGS. 4 to 6, a lower film of AlNd and an upper film of a Mo-containing metal are sequentially deposited on insulating substrate 110 made of a material such as transparent glass or plastic.

Next, a plurality of gate lines 121 including gate electrodes 124 and end portions 129 and a plurality of storage electrode lines 131 including storage electrodes 133a and 133b are formed by wet etching the upper and lower films.

As shown in FIGS. 7 and 8, a gate insulating layer 140 made of a material such as SiNx, an intrinsic a-Si layer 150, and an extrinsic a-Si layer 160 are sequentially deposited on gate lines 121 and storage electrode lines 131 by PECVD. The intrinsic a-Si layer 150 is made of hydrogenated amorphous silicon, and the extrinsic a-Si layer 160 is made of n+ hydrogenated a-Si heavily doped with an n-type impurity such as phosphorous P.

Sequentially, a lower Mo film 170p made of a Mo-containing metal, an Al intermediate film 170q made of an Al-containing film, and a upper Mo film 170r made of a Mo-containing film 170r are sequentially deposited by sputtering such that a data metal layer 170 is formed.

A photoresist is coated on the upper Mo film 170r. The photoresist is exposed to light through an exposure mask (not shown), and the developed photoresist has a position dependent thickness as shown in FIGS. 9 and 10. The developed photoresist includes a plurality of first to third portions 54 and 52. The first portions 54 are located on channel areas B, and the second portions 52 are located on data line areas A. No reference numeral is assigned to the third portions located on the remaining areas C since they have substantially zero thickness. The thickness ratio of the first portions 54 to the second portions 52 is adjusted depending upon the process conditions in the subsequent process steps. It is preferable that the thickness of the first portions 54 is equal to or less than half of the thickness of the second portions 52.

The position-dependent thickness of the photoresist is obtained by several techniques, for example by providing translucent areas on the exposure mask as well as transparent areas and light blocking opaque areas. The translucent areas may have a slit pattern, a lattice pattern, a thin film(s) with intermediate transmittance, or an intermediate thickness. When using a slit pattern, it is preferable that the width of the slits or the distance between the slits be smaller than the resolution of a light projector used for the photolithography. Another example is to use reflowable photoresist. In detail, once a photoresist pattern made of a reflowable material is formed by using a normal exposure mask with only transparent areas and opaque areas, it is subject to a reflow process to flow onto areas without the photoresist, thereby forming thin portions.

Referring to FIGS. 11 and 12, the exposed portions of data metal layer 170 on the remaining areas C are etched by wet etching such that portions 174 and 179 of data metal layer 170 are left on data areas A and channel areas B. Next, exposed portions of the extrinsic a-Si layer 160 and the underlying portions of the intrinsic semiconductor layer 150 on the remaining areas C are removed by dry etching such that the semiconductor patterns 161, 164, 151, and 154 are formed.

Next, the photoresist patterns 54 on the channel areas B are removed by an etch back process. At this time, the thickness of the photoresist pattern 52 reduces by predetermined amount.

Referring to FIGS. 13 and 14, using the photoresist pattern 52 as a mask, the exposed data metal patterns 174 are wet-etched to separate data metal patterns 174 into source electrodes 173 and drain electrodes 175, and expose the extrinsic semiconductor patterns 164 on the channel areas between the source electrodes 173 and drain electrodes 175.

The extrinsic semiconductor patterns 164 on the channel areas are dry-etched using the photoresist pattern 52 as a mask. At this time, a chlorine-containing gas or a fluorine-containing gas is used for dry etching. The chlorine-containing gas may be a gas containing chlorine atoms Cl such as $Cl_2$, HCl, $BCl_3$, $CCl_4$, or $SiCl_2H_2$. The fluorine-containing gas may be supplied by predetermined amount to improve characteristics of the underlying intrinsic semiconductors 154 and may contain fluorine atoms such as $SF_6$ or $CF_4$. An inert gas such as $H_2$ and He may be supplied along with the chlorine-containing gas and the fluorine-containing gas for the dry etching. Dry etching is performed under a pressure of about 100 to 800 mT.

When HCl+$SF_6$+He is used as an etching gas, a flow ratio of $SF_6$:HCl is preferably about 1:4 to 1:10. When $Cl_2$+$SF_6$+ He is used as an etching gas, the flow ratio of $SF_6$:HCl is preferably about 1:1 to 1:10. The flow ratio has a range to improve characteristics of the TFTs, but not to influence the dry etching. In particular, since $Cl_2$ has a bond dissociation energy smaller than that of the HCl, radical and ion emission easily occurs, and a gas amount exhausted for the dry etching decreases. The chlorine-containing gas improves the characteristics of the TFTs.

In detail, when data metal patterns 171, 174, and 179 and intrinsic semiconductor 150 are etched using the same photoresist patterns, data lines 171 including the source electrodes 173 and the end portions 179 and the semiconductors 151 including the projections 154 have substantially the same planar shapes. Areas of the semiconductors 151 exposed to light from a light source such as a backlight unit become wide and increase photo leakage current. The photo leakage current significantly influences data lines 171 having a multi-layered structure of an Al film and an underlying Mo film. That is, the Mo diffuses into semiconductors 151 and impurities split from the lower Al film pollute the semiconductor channel in the wet etching. Accordingly, the TFT characteristics of off-current, threshold voltage are degraded and afterimages, occur.

However, in etching the extrinsic semiconductor patterns 164, that is, in forming the channel areas, the flow ratio of the chlorine-containing gas and the fluorine-containing gas is controlled within the predetermined ratios, to decrease the above disadvantages. In forming the channel areas, when the chlorine-containing gas within the regions is used, the remaining Cl atoms remain in the projections 154 of the semiconductors 151.

TABLE 1 shows test examples indicating that the afterimages decrease when the flow amount of the chlorine-containing gas is different from that of the fluorine-containing gas in forming the channel areas. In each of the test examples, pressure, power, and He supply amount were 170 mT, 3400 W, and 900 sccm, respectively. Furthermore, in each of the test examples, a flow amount of the $SF_6$ was fixed as 150 sccm, and a flow amount of the $Cl_2$ or HCl was controlled based on the flow amount of the $SF_6$ from about 0 to the predetermined ratio, to supply an appropriate flow amount.

The afterimage characteristic was tested as below. First, display panels for a test were prepared, which include channel areas formed by an etching gas having the respective corresponding flow ratio. Each of the display panels included a plurality of pixels arranged in a matrix thereon. Data voltages representing one of intermediate grays between a white gray and a black gray were applied to the display panels, to measure luminance of display screens of the display panels, respectively. Next, data voltages with respect to the black gray and the white gray were alternately applied in a row direction and a column direction to represent the gray and the white gray for about ten hours. Sequentially, after data voltages to the intermediate grays were applied again, luminance of the display screen was detected, to measure afterimage degree.

TABLE 1

| Flow ratio ($SF_6:CL_2$) | After image improvement | Etching characteristic | Flow ratio ($SF_6:HCl$) | After image improvement | Etching characteristic |
| --- | --- | --- | --- | --- | --- |
| 1:0 | x | □ | 1:0 | x | □ |
| 1:0.3 | x | □ | 1:1.12 | x | □ |
| 1:0.7 | Δ | □ | 1:3 | x | □ |
| 1:1 | o | □ | 1:3.5 | □ | □ |
| 1:4 | o | □ | 1:4 | o | □ |
| 1:6 | □ | □ | 1:6.5 | o | □ |
| 1:8.2 | □ | □ | 1:9 | □ | □ |
| 1:9.4 | □ | o | 1:9.5 | □ | o |
| 1:10 | □ | o | 1:10 | □ | o |
| 1:11.2 | □ | □ | 1:11.2 | □ | □ |
| 1:13 | □ | □ | 1:13 | □ | □ |

□: excellent
o: good
□: average
x: bad

As shown in TABLE 1, when the flow ratio of the $SF_6:Cl_2$ or $SF_6:HCl$ was 1:1 or more, or 1:4 or more, respectively, the afterimage was significantly improved. Since the bond dissociation energy of the $Cl_2$ compared to HCl is small such that radicals or ions are easily emitted, the flow ratio of the $Cl_2$ is smaller than that of the HCR. However, when the flow ratio of the $SF_6:Cl_2$ or $SF_6:HCl$ was larger than 1:10, an etching characteristic was influenced.

According to an analysis result using secondary ion mass spectrometry (SIMS), a Cl atom amount remaining on channel areas of semiconductors measured about 3.0 to 20 at %.

FIGS. 21a and 21b are graphs showing characteristic variations of TFTs based on an amount of Cl supplied in detail. FIG. 21a is a graph showing a variation of drain current $I_d$ based on a gate voltage $V_g$ when the flow ratio of $SF_6:HCl$ is 390 sccm:470 sccm, that is, 1:1, and FIG. 21b is a graph showing a variation of drain current $I_d$ based on a gate voltage $V_g$ when the flow ratio of $SF_6:HCl$ is 150 sccm:750 sccm, that is, 1:5. The graph denoted by reference numeral A1 represents a case in which the drain current $I_d$ is measured in a dark room and the other graph, denoted by reference numeral B1, is a case in which the drain current $I_d$ is measured in a light room by irradiation of light.

As shown in the graphs, light leakage current in FIG. 21a is larger than that in FIG. 21b. The light leakage current induces a voltage drop of the drain voltage, to incur the afterimages. Referring to FIGS. 15 to 17 again, the remaining photoresist patterns 52 are removed. As shown in FIGS. 18 to 20, a passivation layer 180 is formed on the exposed gate insulating layer 140, data lines 171 and drain electrodes 175, and the exposed projections 154 of the semiconductors 151.

Sequentially, the passivation layer 180 is removed by photograph etching to form a plurality of contact holes 181, 182, 184, and 185. Finally, as shown in FIGS. 1 to 3, a transparent conducting material such ITO or IZO is formed on the passivation layer 180 by sputtering, and is patterned, to form pixel electrodes 191, contact assistants 81 and 82, and overpasses 84.

According to the present invention, data lines are formed of a multi-layered structure including an Al film and a Mo film, and channel areas are formed using an etching gas of a predetermined flow ratio. Thereby, the characteristics of TFTs are improved and afterimage occurrence decreases.

While this invention has been described in connection with what is presently considered to be practical exemplary embodiments, it is to be understood that various modifications and equivalent arrangements will be apparent to those skilled in the art and may be made without, however, departing from the spirit and scope of the invention.

What is claimed is:

1. A manufacturing method of a thin film transistor array panel comprising:
   forming a gate line on a substrate;
   forming a gate insulating layer, a semiconductor layer, and an ohmic contact on the gate line;
   forming a first conducting film including Mo, a second conducting film including Al, and a third conducting film including Mo on the ohmic contact;
   forming a first photoresist pattern on the third conducting film;
   etching the first, second, and third conducting films, the ohmic contact, and the semiconductor layer using the first photoresist pattern as a mask;
   removing the first photoresist pattern by a predetermined thickness to form a second photoresist pattern;

etching the first, second, and third conducting films using the second photoresist pattern as a mask to expose a portion of the ohmic contact; and etching the exposed ohmic contact using a Cl-containing gas and a F-containing gas.

2. The method of claim 1, wherein the Cl-containing gas is at least one selected from $Cl_2$, HCl, $CCl_4$, $BCl_3$, and $SiCl_2H_2$.

3. The method of claim 2, wherein the Cl-containing gas is $Cl_2$ and a flow ratio of the $Cl_2$ gas and the F-containing gas is 1:1 to 1:10.

4. The method of claim 2, wherein the Cl-containing gas is HCl and a flow ratio of the HCl gas and the F-containing gas is 1:4 to 1:10.

5. The method of claim 1, wherein the F-containing gas is $SF_6$ or $CF_4$.

6. The method of claim 1, wherein the etching of the exposed ohmic contact is performed under a pressure of 100 to 800 mT.

7. The method of claim 1, wherein the first photoresist pattern comprises a first portion and a second portion having a thickness greater than that of the first portion.

8. The method of claim 7, wherein the formation of the second photoresist pattern comprises removing the second portion.

9. The method of claim 1, wherein the etching of the first, second, and third conducting films is performed by wet etching.

* * * * *